United States Patent [19]

Le Meau et al.

[11] Patent Number: 4,733,813
[45] Date of Patent: Mar. 29, 1988

[54] METHOD AND APPARATUS FOR SOLDERING ELEMENTS ON THE CORRESPONDING PADS OF A WAFER, IN PARTICULAR A WAFER HAVING HIGH-DENSITY INTEGRATED CIRCUITS

[75] Inventors: Michel Le Meau, Saint Georges; Jean-Pierre Boiteau, Villeveque; Jean-Yves Vernon, Avrille, all of France

[73] Assignee: Bull S.A., Paris, France

[21] Appl. No.: 914,061

[22] Filed: Oct. 1, 1986

[30] Foreign Application Priority Data

Oct. 1, 1985 [FR] France ................... 85 14587

[51] Int. Cl.⁴ ............... B23K 20/00; B23K 20/10; B23K 20/26
[52] U.S. Cl. ............................. 228/1.1; 228/6.2; 228/237; 29/740; 29/840
[58] Field of Search ............... 228/179, 237, 243, 1.1, 228/6.2; 29/827, 840, 740

[56] References Cited

U.S. PATENT DOCUMENTS

| | | | |
|---|---|---|---|
| 3,529,759 | 9/1970 | Clark | 228/6.2 |
| 3,575,333 | 4/1971 | Kulicke, Jr. et al. | 228/1.1 |
| 3,700,156 | 10/1972 | Hermanns | 228/4.1 |
| 3,747,829 | 7/1973 | Hofmeister | 228/32 |
| 3,938,722 | 2/1976 | Kelly et al. | 228/237 |

FOREIGN PATENT DOCUMENTS

| | | | |
|---|---|---|---|
| 238261 | 2/1965 | Austria | 228/6.2 |
| 2067218 | 8/1971 | France | 228/179 |

Primary Examiner—Nicholas P. Godici
Assistant Examiner—Samuel M. Heinrich
Attorney, Agent, or Firm—Kerkam, Stowell, Kondracki & Clarke

[57] ABSTRACT

An apparatus and method of the soldering or bonding of conductive leads to corresponding conductive pads of an integrated circuit chip includes a fixed soldering tool having a soleplate shaped to match the configuration of the pads, and a bench for supporting the chip. The bench is supported by a plurality of vertically moveable rods located with respect to the bench such that the longitudinal axes of the rods intersect the surface of the chip at predetermined fixed points which are located within a surface area of the chip bonded by a rectangular or square line long which the conductive pads are positioned. The movement of each of the rods is controlled by a corresponding actuator mechanism which enables each rod to be independently controlled. By appropriately controlling the movement of each rod, the bench can be made to tilt or oscillate with respect to its central point. In operation, the rods are controlled so as to move a chip carried on the bench into engagement with the fixed soleplate. Thereafter, the forces are applied to each rod so as to vary the force of contact between different groups of conductive pads and the soleplate. By appropriately controlling the forces applied to the rods, the force required for bonding of the conductive leads to the pads can be sequentially applied to different groups of pads, thereby minimizing the total force on the chip which would otherwise be necessary in order to bond simultaneously all of the conductive leads and pads.

14 Claims, 11 Drawing Figures

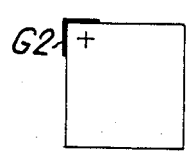 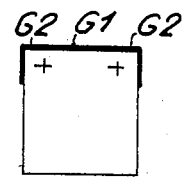 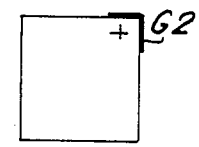
FIG. 3D  FIG. 3E  FIG. 3F
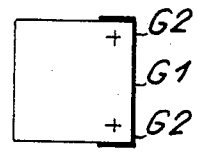 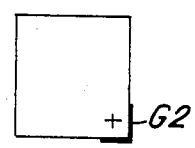
FIG. 3G  FIG. 3H
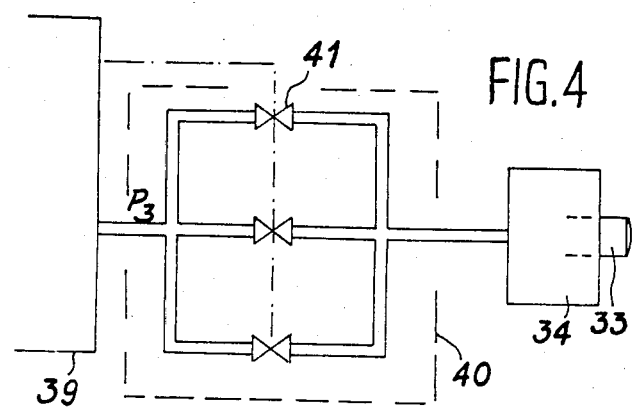
FIG. 4

METHOD AND APPARATUS FOR SOLDERING ELEMENTS ON THE CORRESPONDING PADS OF A WAFER, IN PARTICULAR A WAFER HAVING HIGH-DENSITY INTEGRATED CIRCUITS

The invention relates to a method and an apparatus for soldering elements such as beams leads to the corresponding pads of a wafer.

In general, the invention is applicable to the electrical or electronic field, in which thermo-compression bonding or soldering of elements such as conductor leads to the pads of a chip simultaneously results in an excessive and possibly a damaging force being exerted on the chip, or does not assure good soldering on all the pads. The invention is thus particularly applicable to soldering or bonding of conductor elements such as beam leads to the corresponding bonding pads of a chip, and still more particularly to a wafer with high-density integrated circuits, which at present is known as a VLSI chip (for very large scale integration). Since conventional soldering on VLSI chips presents all the problems that the invention overcomes, it will be taken as an example in the ensuing description.

Chips are ordinarily rectangular, approximately square, silicon wafers, one face or surface of which includes integrated circuits and pads comprising the input/output terminals. These wafers are very thin, on the order of 200 to 700 micrometers, and their surface area depends on the nature of the circuits and on their integration. The largest ones at present are 10 to 15 mm on a side and include more than 350 peripheral pads, generally disposed in a line or staggered on either side of an approximately square geometric line.

Chips are initially made on a slice (or wafer) of silicon. They are then picked up by calipers for insertion into a package or are carried by a tape for use without a package. This is presently known as "micropack" technology. The tape serves to transport and automatically assemble chips on the printed circuit boards. This is currently called tape automated bonding, or TAB. The chips are mounted in the packages or on the tape by soldering their pads to the ends of the corresponding conductors that belong to the package or tape.

Soldering is done in the standard manner, using a device including a bench intended to receive at least one chip in a predetermined position, a block for positioning conductors with respect to the various pads of the chip, a soldering tool provided with a heating soleplate covering all the pads that are to be soldered, a mechanism for relative displacement of the bench and a bonding or soldering tool, and a device for applying force in order to solder the conductors to the corresponding pads of the chip.

The standard soldering method comprises placing a chip on the bench, positioning the conductors with respect to the various pads of the chip, putting the soleplate of the soldering tool, the conductors and the pads in the soldering position, and then simultaneously exerting a predetermined force to solder all the conductors to the pads of the chip simultaneously. Generally, the bench is fixed and the tool is placed upon the conductors and applies the soldering force. The type of soldering done is ordinarily thermocompression or brazing based on tin.

The standard soldering method and apparatus have two major disadvantages when applied to chips having a large surface area or numerous pads.

The first disadvantage derives from the fact that the pads have a very small surface area, on the order of 60 to 250 micrometers on a side, and they cannot hold more than a very small amount of tin for soldering. Hence a relatively high soldering pressure has to be exerted on each pad, the value of which depends on the surface area of the pad and on average is approximately 0.8 Newtons. Thermocompression naturally requires even higher pressures, on the order of twice as high. As a consequence, the standard method for simultaneous soldering of all the pads of a chip, for example 200 pads, results in the application of a very high total force, on the order of 160 Newtons, that is, 15 kg. Since chips are thin substrates that are very fragile, experience has shown that applying such forces damages the chips to a great extent.

This disadvantage is exacerbated by the fact that the chip does not rest on all points on the bench and also that the upper surfaces of the pads are not all coplanar and do not meet the soleplate of the soldering tool exactly. Hence the soldering tool exerts severe non-uniform stresses at different points of the chip.

The second disadvantage is due to the relative disposition of the pads with respect to the soleplate of the soldering tool. The soleplate is initially flat, but it takes on elements resulting from successive soldering operations and oxidizes very quickly. The soleplate is then cleaned and ground regularly. Nevertheless, the grinding quickly wears away the edges of the soleplate and indents them. The pads accordingly make variable contact with the soleplate depending on their position with respect to it and thus are subjected to quite various soldering forces. Very strong forces crush the conductors or damage the pads or their connections with the circuits of the chip, while very weak forces produce soldered connections that are fragile and not very reliable, and may even be defective. As a result, high quality on the part of all the soldered connections is not assured, on the one hand, and on the other, the unequal application of soldering forces produces stresses in the chip that are in addition to those already mentioned.

Furthermore, standard soldering tools have a soleplate made from four bars, assembled at their ends so as to form a rectangle corresponding to the line of pins and supported by posts connected mechanically and electrically to the solid electrodes that supply heating current. The four bars of the soleplate are made of a material selected as a compromise so that it can not only be a good source of heat but can also offer a good surface for the tool to rest on. Titanium-aluminum is such a material, but it has the property of wearing badly. Moreover, the bars of the soldering tool are becoming longer and longer to conform to large chips, and they are subjected to increasingly elevated pressures so that they can exert the required soldering force on all the pads. The result is that these bars become slightly indented and do not uniformly apply the required soldering pressures. The resultant effects are in addition to those mentioned in the foregoing paragraph, so they may soldering even more difficult.

In summary, the technique of the prior art presents the problem of soldering elements to the pads of a wafer without damaging the wafer from the effect of the total soldering force. It also presents the problem of assuring that all the soldered connections on all the pads are of equal quality.

One solution to both these problems is disclosed in an article by Baily et al in the review, "Technical Digest", published by Western Electric, No. 12, October 1968, pages 1 and 2, entitled "Sequential Bonding", and in French Pat. No. 2 067 218. The principle of this solution is to apply a predetermined soldering force sequentially to each of the elements and the corresponding pads of the wafer.

The soldering apparatuses described in these two documents have a fixed bench and a soldering tool that sequentially applies the soldering force to the pads of the wafer with the aid of a mechanism that rotates about the central axis of the wafer along a predetermined angle. In the above-mentioned article, the bench is fixed, and the soldering tool has an axis that forms a predetermined angle with the central axis of the bench. The tool is made to rotate by a chain about the central axis of the table for sequential soldering of each element on the corresponding pad of the wafer. In the above-mentioned patent, the soldering tool exerts a defined soldering force by means of a solid body, this force being applied in a rotating manner by the shaft of a motor and via a rod that forms a predetermined angle with the central axis of the wafer.

The above-mentioned patent also refers to a soldering apparatus including a fixed soldering tool and a bench mounted for oscillation so as to exert the soldering force sequentially on each element and corresponding pad of the wafer. Although the soldering principle is the same, if this soldering apparatus is to be attained, additional problems besides those presented by applying a rotating force via the soldering tool have to be overcome. This patent clearly describes the considerable difficulties that must be overcome for good attainment of a soldering apparatus having an oscillating bench. It also highlights the fact that these difficulties cannot be overcome by making simple improvements, and that the best solution was to make the tool rotatable. Nevertheless, it will be appreciated that soldering apparatus having an oscillating tool as in the above-mentioned documents are also relatively complicated.

The invention seeks to attain a soldering apparatus that offers a simple and inexpensive solution to the above problems by making the bench move with respect to a fixed soldering tool.

According to the invention, the method of soldering elements on the corresponding pins of a wafer by means of a soldering tool having a soleplate covering all the pads and by causing the wafer to oscillate with respect to the soldering tool, is characterized in that the wafer is made to oscillate about a point of its central region by selective action upon predetermined fixed points, located on the interior of the line of pads of the wafer, for the sequential soldering of groups of pads.

As a corollary, a soldering apparatus performing the method according to the invention, intended for soldering elements on the corresponding pads of a wafer and including: a soldering tool having a soleplate covering all the pads; a bench intended for supporting the wafer and mounted for oscillation with respect to the soldering tool while being prevented from rotating in its plane; and a device for applying force causing the bench to oscillate, for sequential soldering of the elements on the pads, is characterized in that the bench is mounted such that it oscillates about a point of the center region of the wafer and the device for applying force includes rods actuated by respective control devices and having axes parallel to the central axis of the bench and intersecting the plane of the line of pads at predetermined fixed points inside this line.

The characteristics and advantages of the invention will become apparent from the ensuing description, made by way of example and taken in conjunction with the accompanying drawings.

Figure 1:
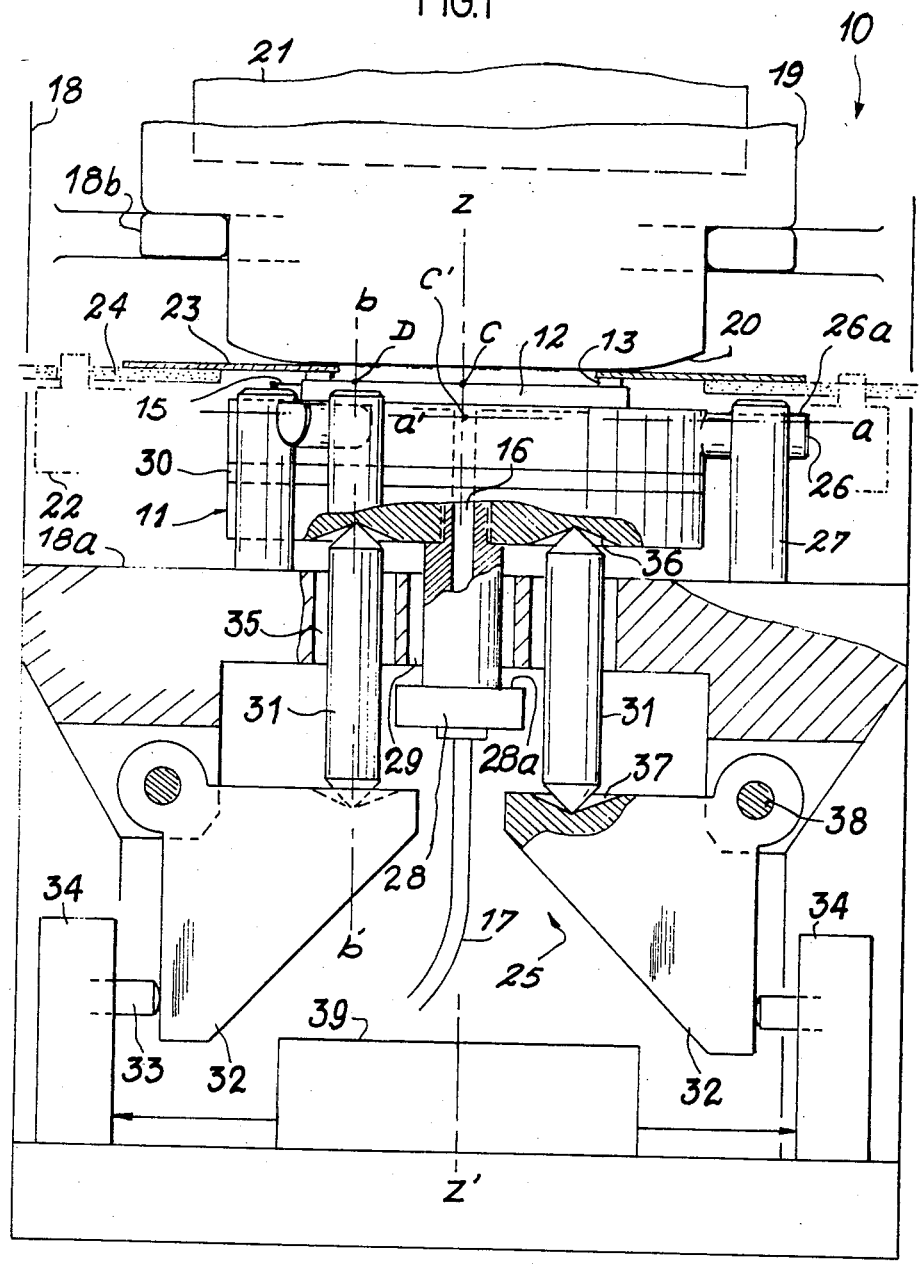
FIG. 1 is a front view, partially cut away, of a soldering apparatus according to the invention.
Figure 2:
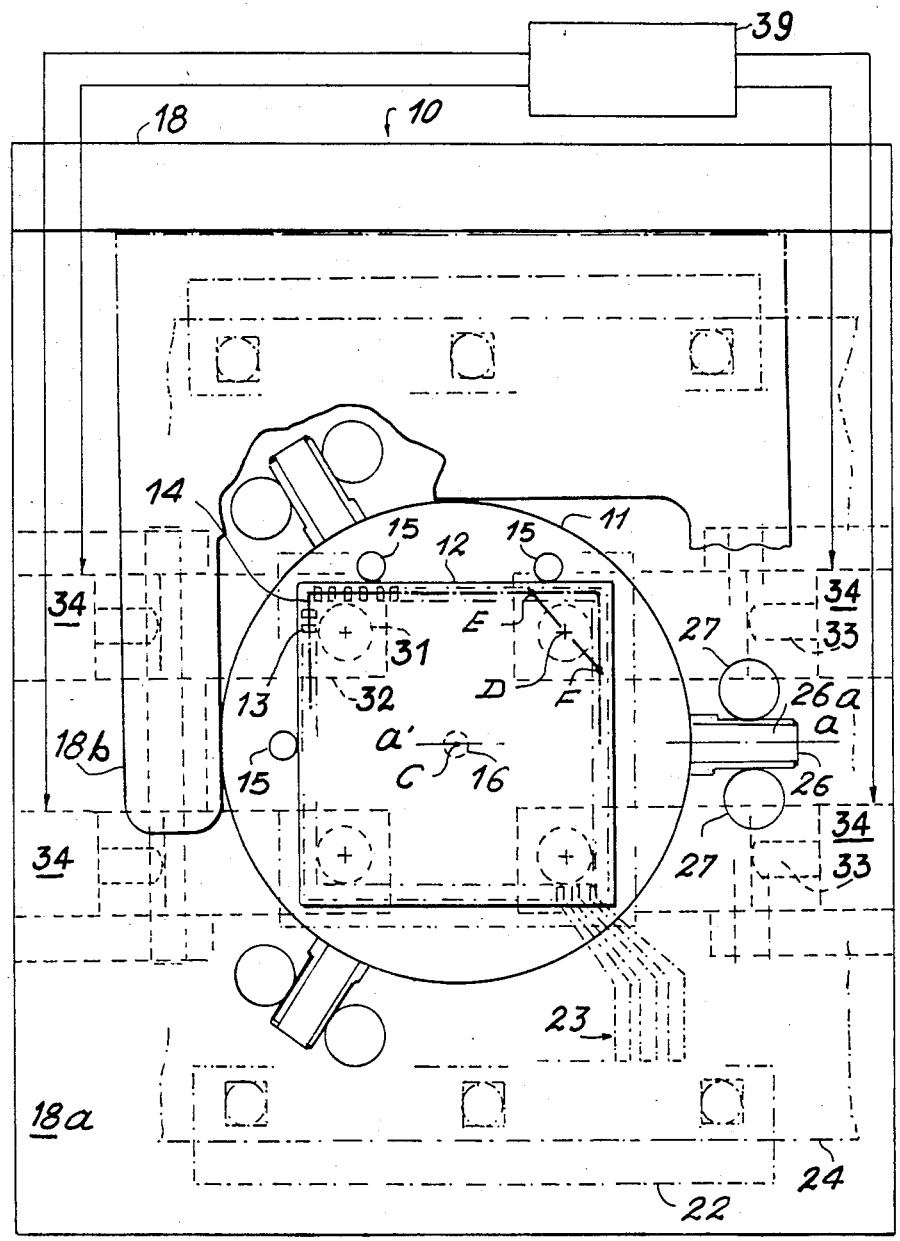
FIG. 2 is a plan view, again partially cut away, of the soldering apparatus shown in FIG. 1, with the soldering tool not shown.

FIGS. 3A-3H, respectively, show the successive positions for soldering conductors on the pads of a schematically illustrated wafer by means of the soldering apparatus shown in FIGS. 1 and 2; and FIG. 4 shows a variant embodiment of the soldering apparatus shown in FIGS. 1 and 2.

FIGS. 1 and 2 show a thermo-compression bonding or soldering apparatus 10 according to the invention. In the conventional manner, the soldering apparatus 10 includes a bench 11 intended for receiving a wafer 12 in a predetermined position. The wafer shown comprises a chip having high-density integrated circuits and provided with bonding pads 13 on its periphery arranged at regular intervals along a line 14 parallel to each side of the chip and represented by dot-dash lines in FIG. 2. A standard chip has a rectangular section, generally approaching a square. Purely by convention, all the accompanying figures show square chips. The center C of a chip is defined by the intersection of its diagonals in the plane of the upper surfaces of the pads 13. The axis ZZ' extending through the center C normal to the plane of the wafer 12 is ordinarily considered to be the vertical reference axis for positioning in a soldering apparatus. The chip 12 is positioned on the bench 11 with the aid of three slugs or rollers 15 in accordance with French Pat. No. 2 397 125 of the assignee of the present invention, which corresponds to U.S. Pat. No. 4,283,845. The bench 11 is traversed along the axis ZZ', and a conduit 16 connected by a duct 17 to a vacuum source, not shown, is provided so as to keep the chip in position.

Also in the standard manner, the frame 18 of the soldering apparatus 10 carries a soldering tool 19 provided with a heating soleplate 20. The soleplate is flat initially and is adapted to the type of chip 12 so as to cover all the pads 13 that are to be soldered. In FIG. 1, the soleplate is a flat square collar, the median line of which corresponds to the line 14 of pads 13 of the chip, and the width of which is greater than the length of the pads in the direction normal to the line 14. The frame 18 includes a mechanism 21 for relative displacement of the table and the soldering tool until the pads are placed in the position for soldering. In the example shown, the mechanism 21 corresponds to the ordinary case, in which it functions to raise and lower the tool. The frame 18 also supports a block 22 for positioning beam leads or conductors 23 with respect to the pads 13 of the wafer. In the example shown, it has been assumed that the conductors 23 are carried by a TAB tape 24, which is displaced and positioned with respect to the axis ZZ' by the positioning block 22 in the manner described in French Pat. No. 2 225 977 of the assignee of the present invention, for example which corresponds to U.S. Pat. No. 3,825,161. Finally, the soldering apparatus includes a device 25 for applying force for thermo-compression bonding or soldering the conductors 23 to the corresponding pads 13 of the chip.

In the soldering apparatus 10 shown in FIGS. 1 and 2, the soldering force is produced by the device 25 for applying force that acts on the bench 11 which is mounted for oscillation. More specifically, the bench 11 is mounted for oscillation about the axis ZZ' at a point C' in the central region C of the chip. For the sake of convenience, the bench 11 shown is cylindrical, with the axis ZZ', and it oscillates about the point C' defined by the intersection of the coplanar axes aa' of three spokes 26 disposed at regular intervals on its periphery. Each spoke 26 is confined between two vertical columns 27 that are fixed to the stage 18a of the frame 18 enable the bench to be displaced vertically and to oscillate about the point C' while preventing it from rotating in its plane about its axis ZZ'.

The bench 11 is also provided with an axial screw 28 mounted coaxially with the axis ZZ' and freely passing through a hole 29 in the stage 18a. The axial screw 28 has a head having a diameter greater than that of the hole 29 so that it presents a shoulder 28a facing the lower surface of the stage 18a.

Furthermore, the bench of a soldering apparatus is typically heated, so as to provide a minimal temperature difference between the soleplate of the soldering tool and the chip. In the example shown in FIG. 1, the bench 11 is heated by an electrical resistance 30 placed in "sandwich" fashion in the plane of the bench between two metal plates.

The device 25 for applying force comprises four vertical rods 31 connecting the bench 11 to four respective tilters 32 each of which is actuated by the finger 33 of a control device 34. The four rods 31 pass through the stage 18a in holes 35. The axes bb' of the rods 31 are parallel to the axis ZZ' and equidistant from it and from one another. The axes bb' intersect the upper plane of the chip 12 at four points D located in the corners of the chip. More specifically, as shown in FIG. 2, the four points D are preferably located in the middle of the line segments EF that join the first quarters of the sides of the rectangular line 14 of pins 13, beginning at each corner. The apexes of the conical ends of the four rods 31 are in contact with the tops of cavities 36, 37 having a conical base that are machined into the lower face of the bench 11 and the horizontal wall of the tilters 32, respectively. These tilters are movable in rotation in a vertical plane about respective axes of the pins or shafts. The four control devices 34 are guided by a control device 39 that determines the movement of each rod 31. Each device 34 may be a pneumatic diaphragm module, coupled to the finger 33, or an electromagnetic coil in which the finger 33 comprises the solenoid plunger.

An example of how the soldering apparatus 10 functions will now be described, referring to FIGS. 1, 2 and 3A–3H. FIG. 2 shows the soldering position schematically represented in FIG. 3A. This initial soldering position is obtained as follows. In a position of repose (not shown) of the soldering apparatus 10, the fingers 33 of the control devices 34 are in a retracted position, which places the bench 11 in a low position, while the soldering tool 19 is in a high position. In the working position, the fingers 33 put the bench 11 in the high position, determined by the abutment of the shoulder 28a of the axial screw 28 against the lower wall of the stage 18a of the frame 18. The soldering tool 19 is lowered, so that it will be supported on the stop 18b of the frame 18. During the descent of the tool 19, the soleplate 20 first comes into contact with the conductors 23, which then come into contact with the pads 13, and then the bench 11 is moved slightly lower, until it reaches the soldering position shown in FIGS. 1 and 3A. The lowering of the bench 11 causes the shoulder 28a to be spaced apart from the stage 18a by a distance sufficient to enable maximum oscillation of the bench and axial screw 18. The holes 29 and 35 in the stage 18a leave sufficient play for enabling the axial screw 28 and the rods 31 to follow the oscillating movement of the bench.

Figure 3A:
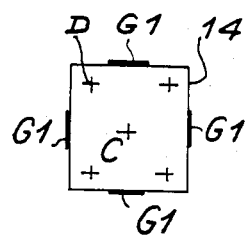

To highlight the characteristics and advantages of the invention better, the soldering position shown in FIG. 3A assumes that the soleplate 20 has a circular collar centered on the axis ZZ' and provided with a width that covers all the pads of the chip. If this soleplate is perfectly flat, all the pins of the chip will be in contact with it when the four rods are all in the high position as shown in FIG. 1. FIG. 3A corresponds to the case where the soleplate is convex as a consequence of successive grinding. In that case, only the groups G1 of pads 13 will be in contact with the soleplate. These groups G1 are necessarily in the middle, since the pads in each corner are farther from the center C and are assumed to be no longer capable of being in contact with the soleplate because of its convexity. The number of pads per group G1 naturally depends on the degree of convexity of the soleplate. For the sake of simpler illustration, the groups G1 are assumed to cover the middle third of each side of the square formed by the line 14 of pads. In FIGS. 3A–3H, each group of pads having to do with the soldering is shown as a heavy line superimposed on the line of pads 14 that is drawn with a fine line. A cross is placed on the inside of the line of pins at the location of a point D, to indicate that the corresponding rod 31 is put in a high position by the associated device 34.

Figure 3B:
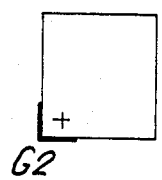
Figure 3C:
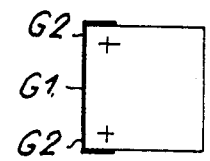

The corner groups 32 are put into soldering position sequentially by the selective command of four devices 34. The pads of the lower left corner, shown in FIG. 3B, are soldered by keeping the device 34 corresponding to the rod 31 that is placed in this corner under pressure and slackening the other control devices. To move to the pads at the upper left corner, the device 34 corresponding to this corner is put under pressure, which results in the soldering position indicated in FIG. 3C, and then this device alone is kept under pressure to obtain the soldering position shown in FIG. 3D. The transition via the position shown in FIG. 3C is a constraint inherent solely in the pneumatic control of the devices 34 selected by way of example. In fact, a direct transition from the position 3B to the position 3D would mean a brutal slackening of the lower left device and the brutal subjection to pressure of the upper left device and would produce undesirable oscillating movements on the part of the bench, which could damage the chip. Making the transition via the position 3C overcomes this disadvantage. In the same way, a transition is made from soldering the pads in the upper left corner to the pins of the upper right corner via the positions 3E and 3F, and thence to the pads of the lower right corner via the positions 3G and 3H. Once the soldering of all the pads has been accomplished, the system returns to its initial position 3A, from which the tool 19 can be raised. In this example, it will be understood that the soldering force the chip 12 undergoes in steps 3A–3H is considerably less than in conventional soldering apparatuses. Furthermore, this example clearly shows that the oscillation of the bench makes it possible to assure uniform quality of the soldered connections of all the pins.

It will now be understood that the center C' of oscillation of the bench 11 must be as close as possible to the center C of the chip 12, so as to reduce or suppress any deviation of the center C with respect to the axis ZZ'. In fact, such a deviation would result in shifting the aligment of the conductors 23 with respect to the pads 13. In the example shown in FIG. 1, the three cylindrical spokes 26 are provided respectively with three upper horizontal flattened areas 26a, which permit the three axes aa' to be located directly underneath the upper surface of the bench and thus to converge at the point C' very near the center C of the chip. The flattened areas 26a are approximately coplanar with the bench so that they will not hinder the positioning of the chip and of the tape. Oscillating the bench 11 of a soldering apparatus 10 according to the invention thus has the advantage that it assures correct soldering of all the pads 13 of a wafer 12, regardless of the unevenness of the surface of the soleplate 20 of the soldering tool 19.

The sequential soldering by groups of pads such as is shown in FIGS. 3A-3H may be improved, in particular in the manner shown in FIG. 4. According to this variant, the control device 39 includes a means 40 for varying the intensity of the force applied to the respective device 34. Means 40 is schematically shown as a block 40 outlined by dash lines in FIG. 4 by way of example. Means 40 is shown as made up of three solenoid valves 41, which are supplied in parallel by the control device 39 and are all connected to the device 34 and are controlled individually by the control device 39. Thus, beginning at the pressure P3 furnished to the block 40 by the control device 39, each control device 34 may receive three possible pressures P1, P2, P3, such as P1=P3/3 and P2=2×P3/3. For example, the pressure p1 will be exerted when the four devices 34 are in action as shown in FIGS. 1-3A. Thus if the soleplate 20 were uniformly flat, it will cover all the pads, but the total force that would be exerted upon the chip 12 would be reduced to one-third of what is necessary to solder all the pads. The soldering can continue as in the case of FIG. 3B by exerting the pressure P3 on the device 34 of the lower left corner of the chip 12. The transition to position 3D may be made gradually, for example by progressively diminishing the pressure on the lower left device 34 while progressively increasing the pressure on the upper left device 34. Each soldering step would be done on a much smaller numer of pads than in the example described in conjunction with FIGS. 3A-3H, which improves the quality of the soldered connections in all the pads, regardless of the degree of convexity of the soleplate.

It will be understood that with a more sophisticated control means 40, the number of pins of each group soldered in succession can be reduced, until attaining the limit of soldering one pad at a time, as with the soldering apparatuses of the prior art having an oscillating tool as described earlier. This limit case could be obtained for example with electromechanical solenoid plunger devices 34 supplied with power respectively by the blocks 40 each embodied by a potentiometer supplied with power and controlled by the control device 39 such that the current intensity, and hence the force applied to each corresponding rod 31, is varied continuously. Generally, the choice of successive steps in the soldering method according to the invention will depend on numerous parameters, such as the fragility of the wafer 12, the density of the pads, the required quality of the soldered connections, and the condition of the soleplate.

It will also be understood in this case that the soldering force may be applied to a number of predetermined points D on the wafer different from four (as shown). For example, three points, or more than four points, may prove advantageous in this case.

We claim:

1. An apparatus for the bonding of elements to respective pads on a surface of a wafer, the pads being arranged along a predetermined line on said surface, comprising a bonding tool having a soleplate located at a fixed predetermined position; a non-rotating bench for supporting said wafer; at least three rods having first ends engaging said bench for supporting the bench for oscillation about a central point thereof, the rods having respective longitudinal axes which intersect the wafer surface at respective predetermined fixed points located within an area of the wafer surface between said predetermined line of pads and said central point; and rod actuator means engaging second ends of said rods for moving the rods along said longitudinal axes and for moving said bench vertically from a rest position which is remote from said soleplate to an operating position at which the soleplate engages the wafer surface, the rod actuating means being formed to enable the rods to be independently moved so as to apply forces to said predetermined fixed points on said wafer surface for oscillating said bench about said central point so as to cause said soleplate to exert sequentially on said elements a required force for bonding the elements to the pads.

2. The apparatus of claims 1, wherein said predetermined line of pads is shaped as a rectangle or a square having a center which is near said central point of said bench, and said area is within said rectangle or square.

3. The apparatus of claim 2, wherein said rods are four in number and each of said predetermined fixed points is located in the middle of a line segment which extends between two adjacent sides of said rectangle or square and intersects each of said sides at approximatly one-quarter of a length of said sides from a corner formed by said sides.

4. The method of claim 1, wherein said axes of said rods are substantially vertical.

5. The apparatus of claim 1, wherein said first ends of said rods are conical-shaped ends which contact conical-shaped cavities on an underside of said bench.

6. The apparatus of claim 1, wherein said rod actuating means includes pneumatic diaphragm modules for controlling the motion of actuating members engaging said second ends of said rods.

7. The apparatus of claim 6, wherein said rod actuating means further includes tilters connecting said actuating members to said second ends of said rods.

8. The apparatus of claim 1, wherein said rod actuating means includes electromagnetic coils for controlling the motions of associated actuating plungers engaging said second ends of said rods.

9. The apparatus of claim 8, wherein said rod actuating means further includes tilters connecting said actuating plungers to said second ends of said rods.

10. The apparatus of claim 1, wherein said rod actuating means further includes means for controlling the intensity of said forces exerted by said rods on said predetermined fixed points on said wafer surface.

11. The apparatus of claim 1, wherein said bench has guiding means comprising at least three spokes having axes which converge in a central region of said bench, each of said spokes being confined between a pair of fixed columns for preventing said bench from rotating, the columns extending upwardly to allow said vertical movement and said oscillation of said bench.

12. An apparatus for the bonding of conductors to respective pads of a VLSI chip, the pads being arranged along a predetermined rectangular line on a surface of the chip, comprising a bonding tool having a soleplate placed at a fixed predetermined position; a bench for supporting the chip; a least three rods for supporting the bench in a nonrotating condition, each of said rods having a longitudinal axis which is substantially perpendicular to the chip surface and which intersects the chip surface at a predetermined fixed point located within an area defined by said rectangular line, the rods having first ends which engage the bench and having second ends which engage rod actuating means formed to enable each of said rods to be independently moved along its longitudinal axis so as to enable said bench to oscillate about a central point of the bench located near a center of said rectangular line, and the rod actuating means being formed for moving the bench vertically between a rest position remove from said soleplate and an operating position at which the bench cooperates with the soleplate to bond the conductors to the pads, and being formed for controlling the rods so as to apply to said predetermined fixed points on the chip surface forces adapted for oscillating the bench and for exerting sequentially on groups of said conductors a required force for bonding the conductors to the pads.

13. The apparatus of claim 12, wherein said rod actuating means further includes means for controlling the intensity of forces exerted by said rods on said predetermined fixed points on said chip surface, whereby the number of said conductors in each of said groups can be reduced to a single conductor to sequentially bond the conductors one-by-one to the pads.

14. The apparatus of claim 12, wherein said conductors are arranged on a TAB tape.

* * * * *

UNITED STATES PATENT AND TRADEMARK OFFICE
CERTIFICATE OF CORRECTION

PATENT NO. : 4,733,813

DATED : March 29, 1988

INVENTOR(S) : Le Meau et al

It is certified that error appears in the above-identified patent and that said Letters Patent is hereby corrected as shown below:

ON THE TITLE PAGE, ITEM [30],

"Oct. 1, 1985" should be --Oct. 2, 1985--.
Abstract, line 11 "long" should be --along--.
Claim 3, line 40, "approximatly" should be --approximately--.
Claim 12, Column 10, line 3, "remove" should be --remote--.

Signed and Sealed this

Twenty-second Day of November, 1988

Attest:

DONALD J. QUIGG

*Attesting Officer*        *Commissioner of Patents and Trademarks*